United States Patent
Tomita et al.

(10) Patent No.: US 6,297,199 B1
(45) Date of Patent: Oct. 2, 2001

(54) RESIN IMPREGNATED OXIDE SUPERCONDUCTOR AND PROCESS FOR PRODUCING SAME

(75) Inventors: Masaru Tomita; Masato Murakami, both of Tokyo (JP)

(73) Assignees: International Superconductvity Technology Center; Railway Technical Research Institute, both of Tokyo (JP)

( * ) Notice: Subject to any disclaimer, the term of this patent is extended or adjusted under 35 U.S.C. 154(b) by 0 days.

(21) Appl. No.: 09/464,800

(22) Filed: Dec. 17, 1999

(30) Foreign Application Priority Data

Dec. 18, 1998 (JP) .................................................. 10-361722

(51) Int. Cl.[7] ............................ B32B 27/04; H01L 39/12; B05D 5/12

(52) U.S. Cl. ......................... 505/233; 505/300; 505/739; 505/818; 427/62

(58) Field of Search ..................................... 505/233, 739, 505/230, 300, 470, 818; 427/62, 63

(56) References Cited

U.S. PATENT DOCUMENTS 5,384,197 * 1/1995 Koyama et al. ..................... 428/457
5,708,405 * 1/1998 Moriyama et al. .................. 335/216

* cited by examiner

*Primary Examiner*—Mark Kopec
(74) *Attorney, Agent, or Firm*—Flynn, Thiel, Boutell & Tanis, P.C.

(57) ABSTRACT

There are disclosed an oxide superconductor which is made of an oxide superconductive bulk body (e.g. a rare earth element base copper-oxide superconductive bulk body) which has a resin impregnated layer (e.g. epoxy base resin impregnated layer), and, optionally, a proper amount of silver or a silver oxide; and a process for producing the above oxide superconductor which comprises impregnating a resin into an oxide superconductive bulk body by bringing the resin in liquid form into contact with the bulk body which is preserved in an atmosphere of reduced pressure. The above superconductor is capable of assuring a high trapped magnetic field and maintaining its performance for a long period of time without being affected by internal or external forces such as electromagnetic forces or thermal strains or by corrosive environments.

9 Claims, 3 Drawing Sheets

PLAN VIEW

FRONT VIEW

SECTIONAL VIEW
TAKEN ON LINE A-A

SECTIONAL VIEW TAKEN ON LINE B-B

RESIN IMPREGNATED OXIDE SUPERCONDUCTOR AND PROCESS FOR PRODUCING SAME

BACKGROUND OF THE INVENTION

1. Field of the Invention

The present invention relates to an oxide superconductor which is capable of trapping a high magnetic field and maintaining its performance for a long period of time without being affected by internal or external forces such as an electromagnetic force or thermal stress or by corrosive environments, and also to a process for producing said oxide superconductor.

A superconducting material, which has a high critical current density as compared with an ordinary conducting material and is capable of passing a large electric current without any loss, has become a center of attraction as a material imparted with epoch-making characteristics in the application fields of magnets and electronics. Accordingly, research and development have vigorously been carried out in recent years on its application in the field of experimental equipment for nuclear fusion, superconductive MRI for medical diagnosis, magnetic levitation trains, electric generators, energy storage units, magnetometers and the like.

2. Description of the Related Arts

By virtue of the spectacular research and development on superconductivity that were initiated in the early stage of this century, a variety of superconducting materials have come to be known. In particular, by the research and development on a metal oxide superconducting material that were initiated in the middle of 1970, there have been found metal oxide superconducting materials each having a relatively high critical temperature (T) such as $LiTi_2O_3$, $Ba(Bi, Pb)O_8$ and $(Ba, K)BiO_8$. In addition, there have successively been created, from 1986 to the present time, copper oxide superconducting materials each having such a relatively high (T) that had never been anticipated before, such as $(La, Sr)_2CuO_4$, $REBa_2Cu_3O_7$ (RE is a rare earth element), $Bi_2Sr_2Ca_2Cu_3O_{10}$, $Ti_2Ba_2Ca_2Cu_3O_{10}$ and $HgBa_2Ca_2Cu_3O_8$.

As described hereinbefore, a superconducting material has a high critical current density as compared with an ordinary conducting material, and thus is capable of passing a large electric current without any loss. However, it is known that in the case of passing such a large electric current, a material is sometimes destroyed depending upon its strength, since a large electromagnetic force acts on a superconductor in question.

Accompanying the enhanced characteristics and large scale operation of relatively high temperature bulk superconductors (particularly, a copper oxide superconductor), the magnitude of a magnetic field capable of being trapped in a bulk superconductor has recently been drastically enhanced, for instance, to the extent that a magnetic flux density exceeding 5 tesla (T) has come to be trapped (refer to "Superconductor Science and Technology" 11, 1998, pp 1345 to 1347). Since an electromagnetic force applied to a superconductor increases with an increase in a trapped magnetic field, there has recently been brought about such a situation in that a restriction is imposed on a trapped magnetic field depending upon the material strength. Under such circumstances, importance is attached to an improvement in mechanical properties rather than a further improvement in a superconducting properties (refer to "Physica C" vol. 7, No. 9, 1991, pp 4989 to 4994 and "Superconductor Science and Technology" 11, 1998, pp 1345 to 1347).

It being so, the following two proposals have been made as a means for reinforcing an oxide bulk superconductor.

One proposal includes a method in which Ag is added to a material in question. It is said that by taking such measures, a remarkable improvement is brought about in the mechanical strength of an oxide bulk superconductor (refer to "Japanese Journal of Applied Physics" vol. 70, No. 9, 1991, pp 4989 to 4994).

The other proposal includes a method in which a compression strain is applied in advance to a material in question by fitting a bulk superconducting material with a metallic ring (refer to "Extended Abstract of ISTEC International Workshop" 1998, pp 115 to 118). It is said that by taking such measures, an improvement is brought about on the trapped magnetic field, since the tensile stress caused at the time of trapping the magnetic field is alleviated by the compression strain which was applied in advance, thereby suppressing the destruction of the material.

Nevertheless, the above-mentioned methods including the reinforcement with Ag addition and reinforcement with a metallic ring are desired to make further improvements in the aspects of workability and manufacturing cost. Moreover, the problem has been recognized in that the reinforced performance is deteriorated by long-term use under a corrosive environment.

SUMMARY OF THE INVENTION

Under such circumstances, a general object of the present invention is to establish a method for readily providing at a low cost, an oxide superconductor which is capable of sufficiently withstanding internal or external force such as a large electromagnetic force or a thermal stress accompanying a sudden rise or drop in temperature at the time of use, and further capable of exhibiting a high trapped magnetic field for a long period of time without being adversely influenced by a corrosive environment.

Other objects of the present invention will be obvious from the text of this specification hereinafter disclosed.

In these circumstances, intensive research and investigation were performed by the present inventors in order to achieve the above-mentioned objects. As a result, novel information and findings as described hereunder have been obtained.

(a) When an oxide bulk superconductor is a ceramic in the state of pseudo-single crystal, it is difficult in practice to prevent microcracks or pores from being internally included during the manufacturing step thereof.

(b) When such an oxide bulk superconductor is subjected to "a strong mechanical impact", "thermal impact due to sudden temperature variation", "a large electromagnetic force" or the like, a stress concentration occurs in the aforesaid microcracks or whereby the microcracks or pores as starting points progress and expand to relatively large cracks.

(c) In the case where the oxide bulk superconductor is exposed for a long time to a corrosive atmosphere containing a large amount of moisture or carbon dioxide gas, the materials for the oxide bulk superconductor deteriorate, or a reaction phase is formed resulting in the generation of new cracks, which progress and expand to relatively large cracks.

(d) The aforesaid relatively large cracks, when being formed, inhibit the flow of the superconductive current, thus greatly decreasing the trapped magnetic field.

(e) However, even if an oxide bulk superconductor is one which has been believed that there is no possibility of internal permeation of a coating material or the like because of an extremely high density due to its generally being produced by a melting method, the application of such a method as resin impregnation under vacuum enables said superconductor to maintain a sufficiently high trapped magnetic field. This is due to the mechanism that the resin permeates not only into the microcracks having openings on the surface, but also into the whole surface layer and further the inside of bulk body through the microcracks, whereby the corrosion resistance of the surface is markedly improved and besides, the mechanical strength of the bulk superconductor itself is drastically enhanced, thereby suppressing, to the utmost, internal forces, external stresses and the propagation of cracking due to corrosion.

(f) In addition, since there is not recognized at all the deterioration due to the resin impregnation, of the superconductivity characteristics of the bulk body matrix, the above-mentioned method is an extremely advantageous means for improving the mechanical properties and corrosion resistance, while maintaining the excellent superconductivity characteristics of the oxide superconductor.

(g) In the case of impregnating a resin into an oxide superconductor bulk body, when said superconductor is perforated in advance, it is made possible to impregnate the resin into the inside of the bulk body through the perforation, thus enabling the production of an advantageous material depending upon the mode of using said oxide superconductor.

The present invention, which has been accomplished on the basis of the above-mentioned information and findings, provides the under-mentioned oxide superconductors and also a process for producing said oxide superconductors.

(1) An oxide superconductor which comprises an oxide superconductive bulk body having a resin impregnated layer.

(2) The oxide superconductor as set forth in Item (1), wherein the oxide superconductive bulk body is a copper oxide superconductor comprising at least one rare earth element selected from the group consisting of Y, La, Nd, Sm, Eu, Gd, Dy, Ho, Er, Tm and Yb.

(3) The oxide superconductor as set forth in Item (1) or (2), wherein the oxide superconductive bulk body is a copper oxide superconductor comprising $REBa_2Cu_3O_y$ as a parent phase wherein RE is at least one rare earth element selected from the group consisting of Y, Dy, Ho, Er, Tm and Yb, and a phase of $RE_2BaCuO_5$ where RE is at least one rare earth element selected from the group consisting of Y, Sm, Eu, Gd, Dy, Ho, Er, Tm and Yb in an amount of at most 50% by volume based on said parent phase.

(4) The oxide superconductor as set forth in Item (1) or (2), wherein the oxide superconductive bulk body is a copper oxide superconductor comprising $RE_{1+x}Ba_{2-x}Cu_3O_y$ as a parent phase wherein RE is at least one rare earth element selected from the group consisting of La, Nd, Sm, Eu, and Gd, and a phase of $RE_{4-2x}Ba_{2+2x}Cu_{2-x}O_{10-2x}$ wherein RE is at least one rare earth element selected from the group consisting of La and Nd, or $RE_2BaCuO_5$ phase wherein RE is at least one rare earth element selected from the group consisting of Sm, Eu and Gd in an amount of at most 50% by volume based on said parent phase.

(5) The oxide superconductor as set forth in Item (3) or (4), wherein the oxide superconductive bulk body comprises at most 40% by weight of Ag.

(6) The oxide superconductor as set forth in any of the proceeding items, wherein the impregnated resin comprises an epoxy based resin.

(7) A process for producing the oxide superconductor as set forth in any of the preceding items which comprises impregnating a resin into an oxide superconductive bulk body by bringing the resin in liquid form into contact with said bulk body in an atmosphere of reduced pressure.

(8) The process for producing the oxide superconductor as set forth in Item (7), wherein the resin is impregnated from the outside surface of the oxide superconductive bulk body.

(9) The process for producing the oxide superconductor as set forth in Item (7), wherein the resin is impregnated from both the outside surface and the inside of the oxide superconductive bulk body by preliminarily perforating the oxide superconductive bulk body.

DESCRIPTION OF PREFERRED EMBODIMENT

Figure 1:
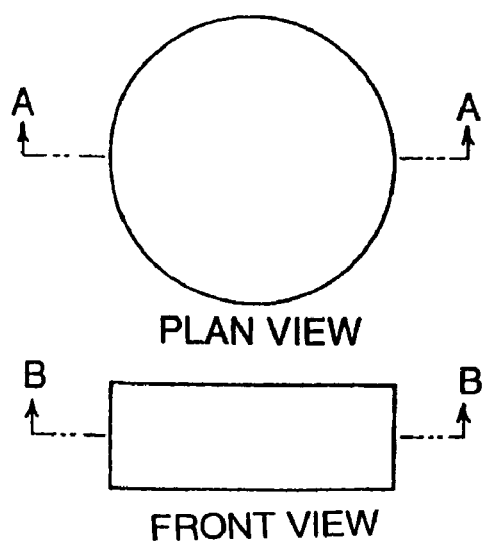
FIG. 1 is an explanatory illustration showing the configuration of the oxide superconductor obtained in Example 1.

The oxide superconductive bulk body to which the present invention is applied, may be any of hitherto known types thereof. Thus, mention may be made as a preferable oxide superconductive bulk body, of a copper oxide superconductive bulk body such as an RE—Ba—Cu—O based superconductor which is known as a relatively high temperature superconductor having a high trapped magnetic field, wherein RE is at least one rare earth element selected from the group consisting of Y, La, Nd, Sm, Eu, Gd, Dy, Ho, Er, Tm and Yb.

Of these, mention may be made as a more preferable oxide superconductor, of an oxide superconductive bulk body which is known as a superconductor having a high trapped magnetic field, comprising $REBa_2Cu_3O_y$ as a parent phase wherein RE is at least one rare earth element selected from the group consisting of Y, Dy, Ho, Er, Tm and Yb and $RE_2BaCuO_5$ as a dispersion phase, wherein RE is at least one rare earth element selected from the group consisting of Y, Sm, Eu, Gd, Dy, Ho, Er, Tm and Yb in an amount of at most 50% by volume based on said parent phase; and of an oxide superconductive bulk body comprising $RE_{1+x}Ba_{3-x}Cu_3O_y$ as a parent phase, wherein RE is at least one rare earth element selected from the group consisting of La, Nd, Sm, Eu, and Gd, and preferably satisfies the relationships $-0.1<x<0.2$ and $6.5<y<7.2$, and $RE_{4-2x}Ba_{2+2x}CU_{2-x}O_{10-2x}$ as a dispersion phase, wherein RE is at least one rare earth element selected from the group consisting of La and Nd, and preferably satisfies the relationship $-0.2<x<0.3$, or $RE_2BaCuO_5$ phase as a dispersion phase, wherein RE is at least one rare earth element selected from the group consisting of Sm, Eu, and Gd in an amount of at most 50% by volume based on said parent phase. The reason for the content of the dispersion phase being defined as at most 50% by volume is that the content of the dispersion phase exceeding 50% by volume reveals a tendency to deteriorate the superconductivity characteristics.

Suitable resins for impregnating into the oxide superconductor are exemplified by an epoxy based resin, urea resin, phenolic resin, unsaturated polyester resin, polyurethane, alkyd resin, melamine resin and the like.

Incorporation of Ag, when necessary, into the oxide superconductive bulk body is advantageous in further enhancing its strength, and also effective in maintaining a high trapped magnetic field. However, when the amount of Ag to be incorporated exceeds 40% by weight, the superconductivity characteristics tend to deteriorate. Accordingly, said amount to be incorporated is preferably suppressed to at most 40% by weight.

A method for impregnating a resin into the oxide superconductive bulk body, is preferably a method in which the resin in liquid form is brought into contact with the oxide superconductive bulk body maintained at a reduced pressure atmosphere such as under a vacuum. However, there is acceptable a method other than the foregoing, such as "a pressurized impregnation method", provided that the method in question enables resin impregnation.

At any rate, a method in which the surface of the oxide superconductive bulk body is only coated with the resin fails to impregnate the resin therein to. This method, even if possible to protect from the corrosive environment, fails to maintain a high trapped magnetic field for a long period of time.

As described hereinbefore, the present invention provides at a low cost, an oxide superconductor which is endowed with sufficient corrosion resistance and mechanical characteristics that are capable of sufficiently withstanding internal or external forces such as a large electromagnetic force or a thermal stress accompanying a sudden rise or drop in temperature at the time of use, and further capable of exhibiting a high trapped magnetic field for a long period of time. Accordingly, the present invention renders itself highly useful in the case of, for instance, putting the oxide superconductive bulk body into practice under a high electromagnetic force, or utilizing the oxide superconductive bulk body as a high-temperature superconductive magnet by allowing it to trap a magnetic field.

In addition, the impregnation of the resin into the oxide superconductive bulk body leads to the working effects not only on suppressing the generation and propagation of cracks originating from microcracks or micropores that are formed at the time of manufacturing the bulk body, and preventing corrosion, but also on alleviating direct mechanical impact applied from outside. In particular, the impregnation of the resin deeply through the surface of the oxide superconductive bulk body, exhibits a marked effect on alleviating the stress generation due to thermal strains caused by temperature differences at the time of cooling.

In summarizing the working effects and advantages of the present invention, the invention readily provides, at a low cost, an oxide superconductor which brings about extremely useful working effects from the industrial aspect, including not only the enhancement of superconductive characteristics such as assuring a high trapped magnetic field, but also the preservation of high trapped magnetic field without deteriorating, even in the cases of use under a thermal history of repeated cooling and heating, under an electromagnetic history of repeated application of an electromagnetic force, or in a corrosive environment for a long period of time.

In the following, the present invention will be described in further detail with reference to working examples, which however, do not limit the present invention thereto.

Example 1

There were prepared five kinds of bulk materials comprising $YBa_2Cu_3O_y$ as a superconductor and a $Y_2BaCuO_5$ phase dispersed therein in an amount of 0, 10, 20, 30, and 40% by volume, respectively by means of the melt-textured-growth (MTG) process.

For the MTG process, according to an ordinary method, each of the starting materials of $YBa_2Cu_3O_y$ was heated to 1100° C. for 20 minutes, thereafter was cooled to 1050° C. for 30 minutes, and after placing $SmBa_2Cu_3O_y$ crystals therein as a seed, was cooled to 900° C. at a cooling rate of 0.5° C./hr.

Melt-growth samples were annealed with oxygen at 400° C. for 250 hours in a stream of oxygen at atmospheric pressure.

Subsequently, each of the bulk superconductors thus obtained was classified into a group without resin impregnation, a group impregnated with a resin in a vacuum vessel under the following condition (1), and a group impregnated with a resin in a vacuum vessel under the following condition (2).

Condition (1)—Bisphenol A type epoxy resin and an aromatic polyamine were mixed at a blending ratio by weight of 100:32, while preheating to 30° C., followed by deaeration under vacuum. Then the bulk superconductor was preheated to 70° C., and was evacuated in a vacuum tank. The mixed resin was poured into the tank so as to cover the bulk body, and was cured by pressurizing over atmospheric pressure, and heating at 80° C. for 6 hours and at 120° C. for 2 hours.

Condition (2)—Bisphenol A type epoxy resin and an aromatic polyamine were mixed at a blending ratio by weight of 100:32, while preheating to 30° C. Then the bulk superconductor was preheated to 70° C. The mixed resin was poured into the tank so as to cover the bulk body, followed by deaeration under a vacuum in the tank. After sufficient defoaming, the impregnated resin was cured by heating under atmospheric pressure at 80° C. for 6 hours and at 120° C. for 2 hours.

Each of the oxide superconductors in the groups thus prepared had the configuration as illustrated in FIG. 1.

Subsequently, each of the superconductors as samples was cooled to 100K. A magnetic field with 10T was applied thereto at 100K, then after cooling to 50K, was gradually lowered, and finally removed. Thereafter, measurements were made of the magnetic field distribution on the surface of the sample by the use of a Hall sensor.

As a result, it was confirmed that all the samples that were not subjected to resin impregnation under a vacuum, had been destroyed. On the other hand, the trapped magnetic field of the samples that were subjected to resin impregnation under a vacuum, showed 2.5T, 3T, 4T, 4T, and 3T for the samples having contents of the Y211 phase of 0, 10, 20, 30 and 40% by volume, respectively.

There was no difference in the values of the trapped magnetic field between the samples that were subjected to resin impregnation under the condition (1) and condition (2).

As the result of observation for the structure of the cross section of the samples that were subjected to resin impregnation, it was confirmed that the resin had been impregnated mainly into microcracks and pores of the bulk material from the surface towards the inside, whereby the surface layer formed a resin impregnated layer.

Figure 2:
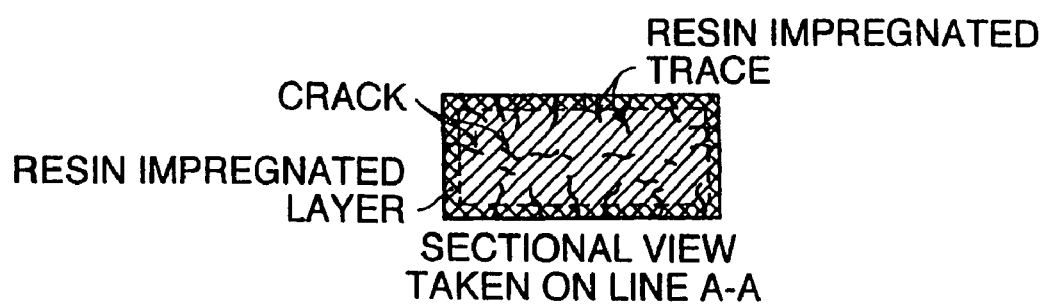
FIG. 2 is a schematic view showing the observed state taken on line A—A of the oxide superconductor as shown in FIG. 1.
Figure 3:
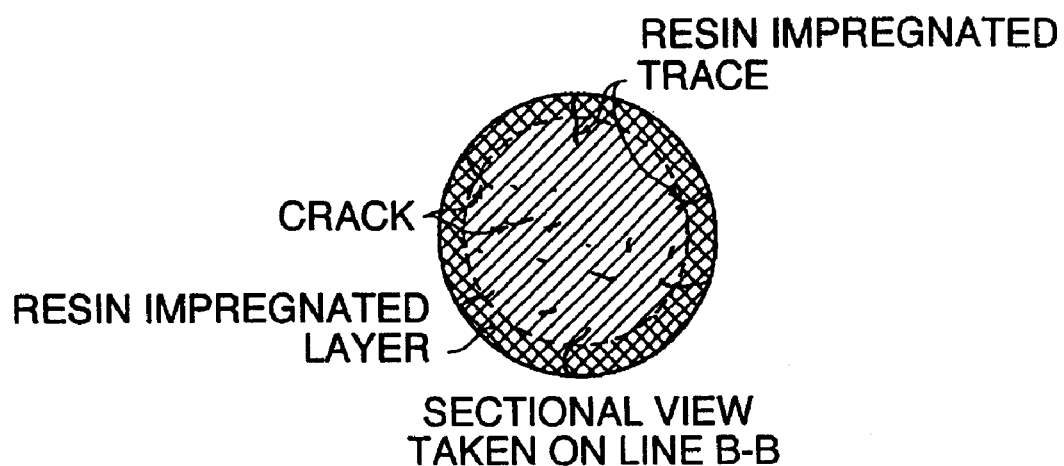
FIG. 3 is a schematic view showing the observed state taken on line B—B of the oxide superconductor as shown in FIG. 1.

FIG. 2 is a schematic sectional view for the observed sample taken on line A—A in FIG. 1, and FIG. 3 is a schematic sectional view for the observed sample taken on line B—B in FIG. 1.

As mentioned above, cracks were observed in all the samples that were not subjected to resin impregnation under a vacuum, but were not observed in all the samples that were subjected to resin impregnation under a vacuum, all of which had a relatively high trapped magnetic field. Needless to say, the difference in trapped magnetic fields due to the difference in the content of the Y211 phase, reflects the difference in the critical current density.

Example 2

There were prepared five kinds of bulk materials comprising $Sm_{0.9}Ba_{2.1}Cu_3O_y$ as a superconductor and a $Sm_2BaCuO_5$ phase (Sm211 phase) dispersed therein in an amount of 0, 10, 20, 30, and 40% by volume, respectively by means of the oxygen-controller-melt-growth (OCMG) process.

For the OCMG process, each of the starting materials of $Sm_{0.9}Ba_{2.1}Cu_3O_y$ was heated to 1200° C. for 20 minutes in flowing mixed gas of argon and oxygen having an oxygen partial pressure of 1%, thereafter was cooled to 1050° C. for 20 minutes, and after placing $NdBa_2Cu_3O_y$ crystals therein as a seed, was cooled to 900° C. at a cooling rate of 0.5° C./hr.

During the course of the growth of the crystals, large cracks were found on the samples having Sm211 phase contents of 0 and 10% by volume, and cracks, although not found visually, were observed on the sample having a Sm211 phase content of 20% by volume.

The samples in the form of bulk superconductors having Sm211 phase contents of 30 and 40% by volume, wherein no cracks were recognized, were annealed with oxygen at 350° C. for 200 hours in flowing oxygen at atmospheric pressure.

Subsequently, each of the bulk superconductors thus obtained was classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was cooled to 100K. A magnetic field of 10T was applied thereto at 100K, then after cooling to 50K, was gradually lowered, and finally removed. Thereafter, measurements were made of the magnetic field distribution on the surface of the sample by the use of a Hall sensor.

As a result, it was confirmed that all the samples that were not subjected to resin impregnation under a vacuum were destroyed. On the other hand, the trapped magnetic field of the samples that were subjected to resin impregnation under a vacuum, showed 8T and 6.5T for the samples having contents of a Sm211 phase of 30 and 40% by volume, respectively.

There was no difference in the values of the trapped magnetic field between the samples that were subjected to resin impregnation under the condition (1) and condition (2).

As mentioned above, cracks were observed in all the samples that were not subjected to resin impregnation under a vacuum, but were not observed in all the samples that were subjected to resin impregnation under a vacuum, all of which had relatively high trapped magnetic fields.

The difference in trapped magnetic fields due to the difference in the content of Sm211 phase, reflects the difference in the critical current density. In addition, the excellent critical current characteristics of Sm based superconductors are reflected by its markedly improved trapped magnetic fields as compared with that of the samples in Example 1.

Example 3

There were prepared five kinds of bulk materials comprising $Nd_{0.9}Ba_{2.1}Cu_3O_y$ as a superconductor and a $Nd_{3.6}Ba_{2.4}Cu_{1.8}O_x$ phase (Nd422 phase) dispersed therein in an amount of 0, 10, 20, 30 and 40% by volume, respectively by means of the OCMG process.

As melting conditions, each of the starting materials of $Nd_{0.9}Ba_{2.1}Cu_3O_y$ was heated to 1040° C. for 20 minutes in a flowing mixed gas of argon and oxygen having an oxygen partial pressure of 0.1%, thereafter cooled to 1010° C. for 20 minutes, and after placing MgO single crystals therein as seed crystals, and cooled to 900° C. at a cooling rate of 0.5° C./hr.

During the course of the growth of the crystals, large cracks were found on the samples having Nd422 phase contents of 0 and 10% by volume, respectively.

The samples in the form of bulk superconductors having Nd422 phase contents of 20, 30 and 40% by volume, respectively, wherein no cracks were recognized, were annealed with oxygen at 300° C. for 300 hours in flowing oxygen at atmospheric pressure.

Subsequently, each of the bulk superconductors thus obtained was classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was cooled to 100K. A magnetic field of 10T was applied thereto at 100K, then after cooling to 50K, was gradually lowered, and finally removed. Thereafter, measurements were made of the magnetic field removed on the surface of the samples by the use of a Hall sensor.

As a result, it was confirmed that all the samples that were not subjected to resin impregnation under a vacuum had been destroyed. On the other hand, the trapped magnetic fields of the samples that were subjected to resin impregnation under vacuum, showed 3T, 6.5T and 5T for the samples having contents of Nd422 phase of 20, 30 and 40% by volume, respectively.

There was no difference in the values of the trapped magnetic field between the samples that were subjected to resin impregnation under the condition (1) and condition (2).

As mentioned above, cracks were observed in all the samples that were not subjected to resin impregnation under a vacuum, but were not observed in all the samples that were subjected to resin impregnation under a vacuum, all of which had relatively high trapped magnetic fields.

Example 4

There were prepared five kinds of bulk materials comprising $YBa_2Cu_3O_y$ as a superconductor, a $Y_2BaCuO_5$ phase dispersed therein in an amount of 0, 10, 20, 30, and 40% by volume, respectively and further, 10% by weight of Ag by means of the MTG process.

As melting conditions, each of the starting materials of $YBa_2Cu_3O_y$ was heated to 1050° C. for 20 minutes, thereafter cooled to 1000° C. for 30 minutes, and after placing $YBa_2Cu_3O_y$ phase therein as a seed crystal, cooled to 900° C. at a cooling rate of 0.5° C./hr.

Melt grown samples were annealed with oxygen at 400° C. for 250 hours in flowing oxygen at atmospheric pressure.

Subsequently, each of the bulk superconductors thus obtained was classified into a group without resin impregnation, a group impregnated with a resin in a vacuum vessel under the following condition (1) in Example 1, and a group impregnated with a resin in a vacuum vessel under the following condition (2) therein.

Subsequently, each of the superconductors as samples was cooled to 100K. A magnetic field of 10T was applied thereto at 100K, then after cooling to 50K, was gradually lowered, and finally removed. Thereafter, measurements were made of the magnetic field distribution on the surface of the sample by the use of a Hall sensor.

As a result, it was confirmed that all the samples which were not subjected to resin impregnation under a vacuum and which had Y211 contents of 0 and 10% by volume, were destroyed. The trapped magnetic field of the samples which had not been destroyed and which had Y211 contents of 20, 30 and 40% by volume, was 1.5T, 3T and 2T, respectively.

On the other hand, all the samples which were subjected to resin impregnation under a vacuum were not destroyed. The trapped magnetic fields of the samples subjected to resin impregnation under a vacuum, were 2.5T, 3T, 4.5T, 5T, and 3T for the samples having Y211 phase contents of 0, 10, 20, 30 and 40% by volume, respectively. From the comparison of the trapped magnetic fields among the samples which were not destroyed, it was seen that the samples which were subjected to resin impregnation under a vacuum had higher trapped magnetic fields in all cases.

There was no difference in the values of the trapped magnetic fields between the samples which were subjected to resin impregnation under the condition (1) and condition (2).

It can be seen from the foregoing that Y based samples incorporated with Ag are also improved in trapped magnetic field by the resin impregnation under a vacuum.

Example 5

There were prepared five kinds of bulk materials comprising $Sm_{0.9}Ba_{2.1}Cu_3O_y$ as a superconductor, a $Sm_2BaCuO_6$ phase (Sm211 phase) dispersed therein in an amount of 0, 10, 20, 30 and 40% by volume, respectively and, further, 10% by weight of Ag by means of the OCMG process.

As melting conditions, each of the starting materials of $Sm_{0.9}Ba_{2.1}Cu_3O_y$ was heated to 1010° C. for 20 minutes in a stream of a mixed gas of argon and oxygen having an oxygen partial pressure of 1%, thereafter cooled to 990° C. for 20 minutes, and after placing $SmBa_2Cu_3O_y$ crystals therein as a seed, cooled to 850° C. at a cooling rate of 0.5° C./hr.

During the course of the growth of the crystals, cracks, although not found visually, were observed on the sample not containing the Sm211 phase.

The samples in the form of bulk superconductors having Sm211 phase contents of 10, 20, 30 and 40% by volume, respectively, wherein no cracks were recognized, were annealed with oxygen at 350° C. for 200 hours in flowing oxygen at atmospheric pressure.

Subsequently, each of the bulk superconductors thus obtained was classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was cooled to 100K. A magnetic field of 10T was applied thereto at 100K, then, after cooling to 50K, was gradually lowered, and finally removed. Thereafter, measurements were made of the magnetic field distribution on the surface of the sample by the use of a Hall sensor.

The trapped magnetic field of the samples which were not subjected to resin impregnation under a vacuum and which had Sm211 contents of 10, 20, 30 and 40% by volume, was 5T, 6T, 6T and 4T, respectively.

On the other hand, the trapped magnetic field of the samples which were subjected to resin impregnation under a vacuum and which had Sm211 contents of 10, 20, 30 and 40% by volume, was 6T, 9T, 9T and 7T, respectively.

There was no difference in the values of the trapped magnetic field between the samples subjected to resin impregnation under the condition (1) and condition (2).

It has been confirmed from the foregoing that Sm base samples incorporated with Ag are also improved in trapped magnetic field by the resin impregnation under a vacuum.

Example 6

There was prepared a bulk material comprising $Sm_{0.9}Ba_{2.1}Cu_3O_y$ as a superconductor, a $Sm_2BaCuO_6$ phase (Sm211 phase) dispersed therein in an amount of 30% by volume, and further, 10% by weight of silver oxide by means of the OCMG process.

As melting conditions, the starting material of $Sm_{0.9}Ba_{2.1}Cu_3O_y$ was heated to 1010° C. for 20 minutes in a flowing mixed gas of argon and oxygen having an oxygen partial pressure of 1%, thereafter cooled to 990° C. for 20 minutes, and after placing $SmBa_2Cu_3O_y$ therein as a seed crystal, was cooled to 850° C. at a cooling rate of 0.5° C./hr.

OCMG processed bulk superconductors were annealed with oxygen at 350° C. for 200 hours in flowing oxygen at atmospheric pressure.

Subsequently, the bulk superconductors thus obtained were classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was cooled to 100K. A magnetic field of 10T was applied thereto at 100K, then, after cooling to 77K by immersion in liquefied nitrogen, was gradually lowered, and finally removed. Thereafter, measurements were made of the magnetic field distribution on the surface of the sample by the use of a Hall sensor.

Thereafter, the above mentioned step was repeated, and the resultant trapped magnetic field was measured each time of repetition.

Figure 4:
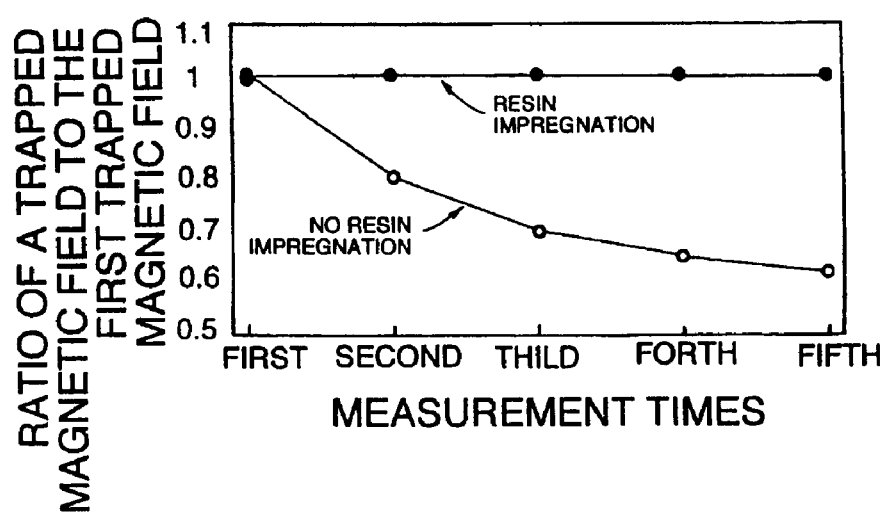
FIG. 4 is a graph showing a result of the measurement of the trapped magnetic field of Sm based oxide superconductors as obtained in Example 6.

FIG. 4 illustrates the change in the trapped magnetic field with the number of repetitions on the basis of the trapped magnetic field measured at the first time defined [1] as the index.

It is clearly understood from FIG. 4, that the trapped magnetic field decreases with an increase in the number of repetitions in the case of the samples which were not subjected to resin impregnation under a vacuum, whereas the trapped magnetic field does not change at all in the case of the samples which were subjected to resin impregnation under a vacuum.

There was no difference in the values of the trapped magnetic field between the samples which were subjected to resin impregnation under the condition (1) and condition (2).

As indicated above, it has been confirmed that the samples which are subjected to resin impregnation under a vacuum are effective in preventing the deterioration of the trapped magnetic field due to repeated cooling or repeated application of electromagnetic force.

Example 7

There were prepared bulk materials comprising $Gd_{0.9}Ba_{2.1}Cu_3O_y$ as a superconductor, a $Gd_2BaCuO_5$ phase (Gd211 phase) dispersed therein in an amount of 30% by volume, and further, 10% by weight of a silver oxide by means of the OCMG method.

As melting conditions, the starting material of $Gd_{0.9}Ba_{2.1}Cu_3O_y$ was heated to 1000° C. for 20 minutes in a flowing mixed gas of argon and oxygen having an oxygen partial pressure of 1%, thereafter cooled to 980° C. for 20 minutes, and after placing $GdBa_2Cu_3O_y$ crystals therein as a seed, cooled to 850° C. at a cooling rate of 0.5° C./hr.

After the growth of the crystals, the samples in the form of bulk superconductors were annealed with oxygen at 350° C. for 200 hours in flowing oxygen at atmospheric pressure.

Subsequently, the bulk superconductors thus obtained were classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was cooled to 100K. A magnetic field of 10T was applied thereto at 100K, then after cooling to 77K by immersion in liquefied nitrogen, was gradually lowered, and finally removed. Thereafter, measurements were made of the magnetic field distribution on the surface of the sample by the use of a Hall sensor.

Thereafter, the above mentioned step was repeated, and the resultant trapped magnetic field was measured each time of repetition.

Figure 5:
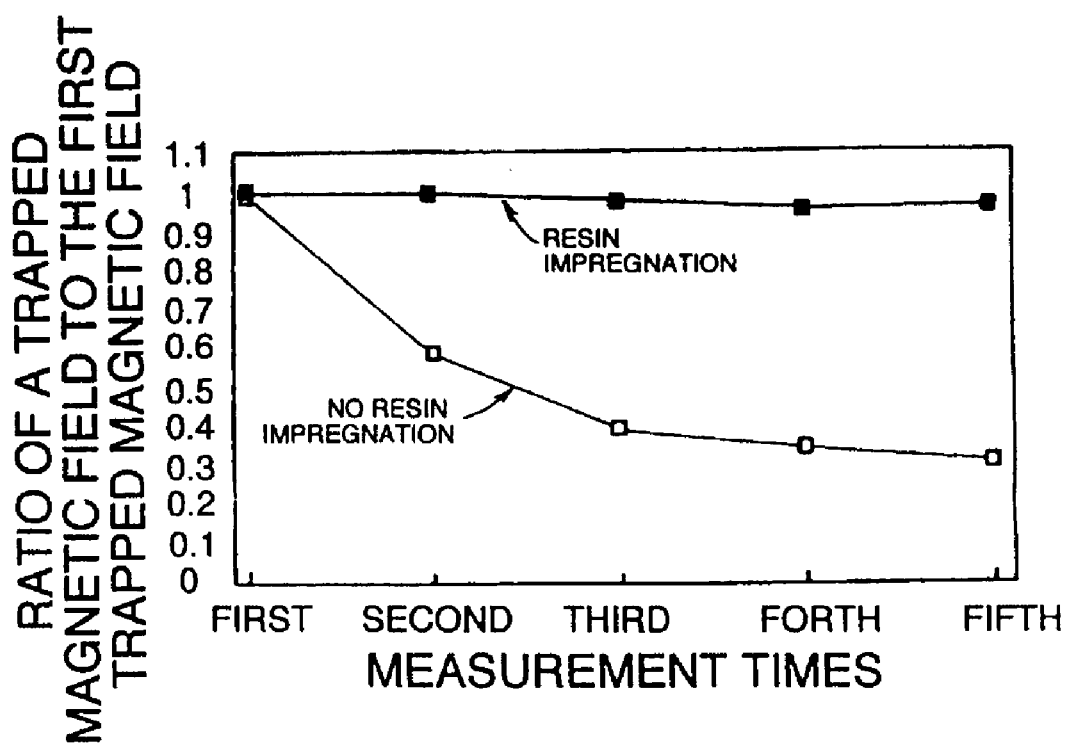
FIG. 5 is a graph showing a result of the measurement of the trapped magnetic field of Gd based oxide superconductors as obtained in Example 7.

FIG. 5 illustrates the change in the trapped magnetic field with the number of repetitions on the basis of the trapped magnetic field measured at the first time defined [1] as the index.

It is clearly understood from FIG. 5, that the trapped magnetic field decreases with an increase in the number of repetitions in the case of the samples which were not subjected to resin impregnation, whereas the trapped magnetic field does not change at all in the case of the samples which were subjected to resin impregnation under a vacuum.

There was no difference in the values of the trapped magnetic field between the samples which were subjected to resin impregnation under the condition (1) and condition (2).

As indicated above, it has been confirmed that the samples which are subjected to resin impregnation under a vacuum are effective in preventing the deterioration of a trapped magnetic field due to repeated cooling or repeated application of an electromagnetic force.

Example 8

There were prepared bulk materials comprising $YBa_2Cu_3O_y$ as a superconductor and a $Y_2BaCuO_5$ phase dispersed therein in an amount of 30% by volume by means of the MTG process.

As melting conditions, the starting materials of $YBa_2Cu_3O_y$ were heated to 1100° C. for 20 minutes, thereafter cooled to 100° C. for 30 minutes, and after placing $SmBa_2Cu_3O_y$ crystals therein as a seed crystal, cooled to 900° C. at a cooling rate of 0.5° C./hr.

Melt grown bulk superconductors were annealed with oxygen at 400° C. for 250 hours in a stream of flowing oxygen at atmospheric pressure.

Subsequently, the bulk superconductors thus obtained were classified into a group without resin impregnation, a group impregnated with a resin in a vacuum vessel under the condition (1) in Example 1, and a group impregnated with a resin in a vacuum vessel under the condition (2) therein.

Subsequently, each of the superconductors as samples was subjected to repeated steps comprising cooling to 77K by direct immersion in liquefied nitrogen, and raising the temperature up to room temperature.

As a result, cracks were visually observed after three times of repeated cooling and temperature raising in the samples which were not subjected to resin impregnation under a vacuum, but were not observed even after twenty times of repeated cooling and temperature raising in the samples which were subjected to resin impregnation under a vacuum.

There was no difference in the values of the trapped magnetic field between the samples which were subjected to resin impregnation under the condition (1) and condition (2).

The above mentioned experimental results demonstrate not only does the treatment of the bulk superconductor samples which are subjected to resin impregnation under a vacuum enhance the mechanical strength of the samples, but also that the impregnated resin functions as a thermally insulating material against large differences in temperature between the surface and inside of samples which is caused when the samples are cooled with liquefied nitrogen, thereby markedly contributing to the alleviation of thermal stress.

The above exemplified examples are limited to the examples including resin-impregnated copper oxide superconductors of Y, Sm, Nd and Gd bases, respectively. It has been confirmed, however, that excellent working effects and advantages that are the same as in the examples, are exerted by resin-impregnated oxide superconductor bulk bodies of La, Eu, Dy, Ho, Er, Tm and Yb bases, respectively, or of composite systems containing at least two of the rare earth metals exemplified above.

What is claimed is:

1. An oxide superconductor which comprises an oxide superconductive bulk body having a resin impregnated layer comprising an oxide superconductive material and the resin.

2. The oxide superconductor as set forth in claim 1, wherein the oxide superconductive bulk body is a copper oxide superconductor comprising at least one rare earth element selected from the group consisting of Y, La, Nd, Sm, Eu, Gd, Dy, Ho, Er, Tm and Yb.

3. The oxide superconductor as set forth in claim 2, wherein the oxide superconductive bulk body is a copper oxide superconductor comprising $REBa_2Cu_3O_y$ as a parent phase wherein RE is at least one rare earth element selected from the group consisting of Y, Dy, Ho, Er, Tm and Yb, and a phase of $RE_2BaCuO_5$ phase wherein RE is at least one rare earth element selected from the group consisting of Y, Sm, Eu, Gd, Dy, Ho, Er, Tm and Yb in an amount of at most 50% by volume based on said parent phase.

4. The oxide superconductor as set forth in claim 2, wherein the oxide superconductive bulk body is a copper oxide superconductor comprising $RE_{1+x}Ba_{2-x}Cu_3O_y$ as a parent phase wherein RE is at least one rare earth element selected from the group consisting of La, Nd, Sm, Eu, and Gd, and a phase of $RE_{4-2x}Ba_{2+2x}Cu_{2-x}O_{10-2x}$ wherein RE is at least one rare earth element selected from the group consisting of La and Nd, or $RE_2BaCuO_5$ phase wherein RE is at least one rare earth element selected from the group consisting of Sm, Eu and Gd, in an amount of at most 50% by volume based on said parent phase.

5. The oxide superconductor as set forth in claim 3 or 4, wherein the oxide superconductive bulk body comprises at most 40% by weight of Ag.

6. The oxide superconductor as set forth in claim 1, wherein the impregnated resin comprises an epoxy base resin.

7. A process for producing the oxide superconductor as set forth in claim 1 which comprises impregnating a resin into an oxide superconductive bulk body by bringing the resin in liquid form into contact with said bulk body preserved in an atmosphere of reduced pressure.

8. The process for producing the oxide superconductor as set forth in claim 7, wherein the resin is unpregnated from the outside surface of the oxide superconductive bulk body.

9. The process for producing the oxide superconductor as set forth in claim 7 wherein the resin is impregnated from both the outside surface and the inside of the oxide superconductive bulk body by preliminary perforating the oxide superconductive bulk body.

* * * * *